United States Patent [19]

Champion et al.

[11] Patent Number: 4,625,176
[45] Date of Patent: Nov. 25, 1986

[54] ELECTROSTATIC PROBE

[75] Inventors: James R. Champion; Clarke A. Yeager, both of Longmont, Colo.

[73] Assignee: International Business Machines Corporation, Armonk, N.Y.

[21] Appl. No.: 531,565

[22] Filed: Sep. 13, 1983

[51] Int. Cl.[4] .......................................... G01R 29/12
[52] U.S. Cl. .............................. 324/458; 355/14 CH; 324/457
[58] Field of Search ...................... 324/72.5, 458, 457, 324/58 P, 61 P; 310/331, 332, 333, 365, 366, 316; 355/14 CH, 14 D

[56] References Cited

U.S. PATENT DOCUMENTS

| | | | |
|---|---|---|---|
| 3,379,972 | 4/1968 | Foster | 324/61 P |
| 3,739,299 | 6/1973 | Adler | 310/331 |
| 3,788,739 | 1/1974 | Coriale | 355/14 CH |
| 3,997,839 | 12/1976 | Dreyfus | 324/109 |
| 4,106,869 | 8/1978 | Buchheit | 324/32 |
| 4,147,981 | 4/1978 | Williams | 324/72.5 |
| 4,189,673 | 2/1980 | Shintaku | 324/458 |
| 4,205,267 | 5/1980 | Williams | 324/458 |
| 4,261,660 | 4/1981 | Suzuki | 355/14 R |
| 4,266,870 | 5/1981 | Eda | 355/14 D |
| 4,267,511 | 5/1981 | Suzuki | 324/458 |
| 4,326,796 | 4/1982 | Nishimura | 355/14 CH |
| 4,367,948 | 1/1983 | Suzuki | 324/458 |
| 4,370,616 | 1/1983 | Williams | 324/458 |
| 4,473,857 | 9/1984 | Winter | 324/72.5 |

OTHER PUBLICATIONS

U.S. Publication: Piezoceramic Bender Elements by Gulton Industries, Inc.

Primary Examiner—Reinhard J. Eisenzopf
Assistant Examiner—G. Peterkin
Attorney, Agent, or Firm—Charles E. Rohrer

[57] ABSTRACT

This describes a vibrating probe for measuring electrostatic surface potential. A multilayered piezoceramic bender element assembly is provided with a multilayered shield surrounding the bender assembly on all sides except for one opening window. The conductive sense element of the bender assembly is located in the window and is positioned near the surface to be measured. The bender assembly includes a conductive layer sandwiched between a drive piezoceramic layer and a feedback piezoceramic layer. The feedback piezoceramic layer is coated (on the side opposite to the inner conductive layer) with the conductive sense element and with a separate conductive area for connection to a drive oscillator. The multilayered shield is comprised of inner and outer conductive layers sandwiching an insulator. A circuit is provided whereby the sensed signal floats on a high voltage signal applied to the conductive layers of the shield. A drive oscillator also floats on the high voltage signal and is connected to the drive element.

5 Claims, 6 Drawing Figures

ELECTROSTATIC PROBE

This invention relates to a probe and its associated circuit for measuring the voltage level of an electrostatically charged surface and more particularly to the unique construction of a vibrating piezoceramic probe and its unique circuit. The probe can be applied to any process or machine for the measurement of electrostatic surface potential, including electrophotographic copier and print machines.

BACKGROUND OF THE INVENTION

In electrophotographic machines, a photoconductive material receives a relatively uniform charge level which may be, for example, 800 volts. Since the photoconductive material is an insulator, that charge remains on the material until it is exposed to light. When exposed, the exposed portion of the photoconductor is discharged to a level which can approach zero volts. In the electrophotographic process, the exposed photoconductor is then developed and a print is made from the developed image.

Print quality in an electrophotographic machine deteriorates over a period of time as the electrostatic properties of the photoconductive material change with age. Also, repeated use of the photoconductor can change surface properties and affect print quality. For example, repeated application of developing material can film the surface and make it less receptive to light. Additionally, since print paper is pressed against the photoconductor during the transfer of the image to the paper, the surface of the photoconductor is roughened and darkened. These factors add together to change the charge and light receptivity of the photoconductor and eventually necessitate its replacement.

In order to improve and maintain print quality over the life of the photoconductor, electrostatic probes are placed near the photoconductive surface to sense changes in electrostatic charge level. When significant changes in charge levels are sensed, either the charge level, the illumination intensity, or the developer bias level can be adjusted in order to compensate for the changes. See, for example, the system described in U.S. Pat. No. 4,326,796.

Despite the advantages which are theoretically achievable from the use of an electrostatic probe in an electrophotographic machine, such probes have not come into common use. Reasons for that include the expense of the probe and its associated circuitry together with relatively poor sensing capabilities which limit the value of the measurement. This invention seeks a solution to these problems by providing a probe of unusual and unique construction which combines several functions into a single piezoelectric bender element thus reducing the cost of the probe itself and enabling a probe of improved sensing capability.

When probes are used to measure the charge on an electrostatic surface, an initial requirement is to establish a reference to calibrate the significance of the measured quantity. In electrophotographic machines which have a conductive drum seal breaking the continuity of the photoconductive surface, the charge level of the drum seal can provide the needed reference since such a seal is grounded or at some other known potential. In other electrophotographic machines where the photoconductive surface is continuous, chopping schemes are often used to momentarily shield the probe from the unknown voltage on the photoconductive surface and replace it with a reference voltage. The probe of this invention utilizes a different scheme, a nulling arrangement where the photoconductor voltage is successively compared to a known voltage which is varied until the two are equal. Schemes of this type utilize a vibrating sense electrode placed between a surface of unknown potential (the photoconductor) and another surface of known potential. As the electrode vibrates, the capacitance between the unknown potential and the sense electrode changes to generate a current in the electrode. That current is used to increase or decrease the potential on the known surface until it equals the photoconductor voltage. At that point, the vibrating electrode output is reduced to zero.

Vibrating probes generally have three elements, a drive element, a sense element, and a feedback element. Tuning forks are usually used as the vibrator and have a magnetic or piezoelectric element attached as a driver to set the tuning fork into oscillation. A sense element, a conductor of some kind, is attached to the tuning fork, and a feedback element is often attached in order to maintain the frequency of the tuning fork at resonance. Such probes are difficult to manufacture and are expensive. The object of this invention is to eliminate bulky apparatus such as tuning forks to enable close positioning of the vibrating probe to the surface to be measured in order to improve probe sensitivity and reduce its cost.

SUMMARY OF THE INVENTION

Briefly stated, this invention provides a probe for measuring electrostatic potential where the probe is made from a single piezoceramic bender element surrounded (except for a sense window) by a shield at a known potential. The bender element is comprised of a piezoceramic drive layer connected to a drive oscillator, a sensing conductor, and a piezoceramic feedback layer also connected to the drive oscillator. As the oscillator supplies current to the piezoceramic drive element, the bender element deforms. Deformation of the bender element includes a deformation of the piezoceramic feedback element thus inducing a current in the feedback layer. The induced current is fed back to the oscillator to tune the output of the oscillator to the natural resonant frequency of the bender element. The sense element (part of the vibrating bender element) is placed near the electrostatic potential to be measured, and is located within the field generated between the shield and the surface to be measured. As the crystal bender element vibrates, a current is induced in the conducting sense element due to the change of capacitance as the sense element moves toward and away from the photoconductor. The current thus produced is connected to an amplifying, filtering and phase sensing circuit so that adjustments can be made to the known potential on the shield in order to eliminate the presence of the electrostatic field. When that occurs, there is no further induced current in the sense element and the known potential on the shield is equal to the surface potential to be measured.

Thus, this invention provides a small, simple and cheap electrostatic probe comprised of a single bender element which acts as a drive element, a sensor element and a feedback element all in one.

For the simple probe of this invention to operate properly, it is necessary to float the sensed voltage (in the millivolt range) on the known potential provided on the probe shield (which may be several hundred volts). Additionally, the sensed voltage must be shielded from the oscillator drive voltage (which is many times larger) and the oscillator drive voltage must itself float on the known potential on the shield. Finally, the oscillator drive voltage must be disconnected from the oscillator during the measurement period in order to decouple any low impedances in the oscillator voltage supply from the sense resistor. A unique circuit and shielding arrangement to implement this device is described herein.

BRIEF DESCRIPTION OF THE DRAWING

The above-mentioned and other features and objects of this invention and the manner of attaining them will become more apparent and the invention itself will best be understood by reference to the following description of embodiments of the invention taken in conjunction with the accompanying drawing, the description of which follows.

DETAILED DESCRIPTION

Figure 1:
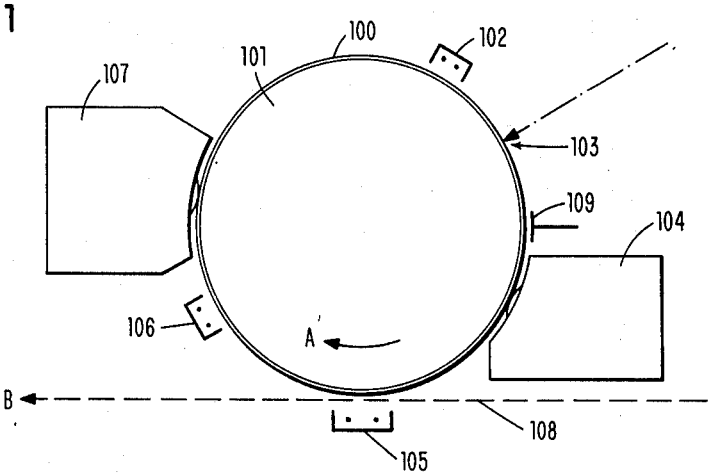
FIG. 1 is a diagrammatical representation of the major components of an electrophotographic machine.

FIG. 1 is a diagrammatical representation showing the major components of a typical electrophotographic machine and also showing the inventive probe unit 109. A photoconductor 100 is mounted on the outer surface of a drum 101 which is driven to rotate in direction A. As the photoconductor passes under charge corona 102, a relatively uniform electrostatic charge is placed across the surface of the photoconductor. An image is produced by selectively discharging the photoconductor at the exposure station 103. The image is developed by developer 104 and is transferred to receiving material, usually paper, under the influence of transfer corona 105. A cleaning corona 106 precedes the cleaning station 107. The receiving material is moved along a paper path 108 in direction B.

A probe unit 109 is located to sense the electrostatic voltage level present on the photoconductor. By locating the probe 109 subsequent to the exposure station 103, it is possible to sense the fully exposed voltage level of the photoconductor as well as the unexposed voltage level. These sensed voltage levels are fed to control circuits to adjust the charge corona 102, the intensity of illumination at exposure station 103, or the developer bias voltage level at developer 104.

Figure 2:
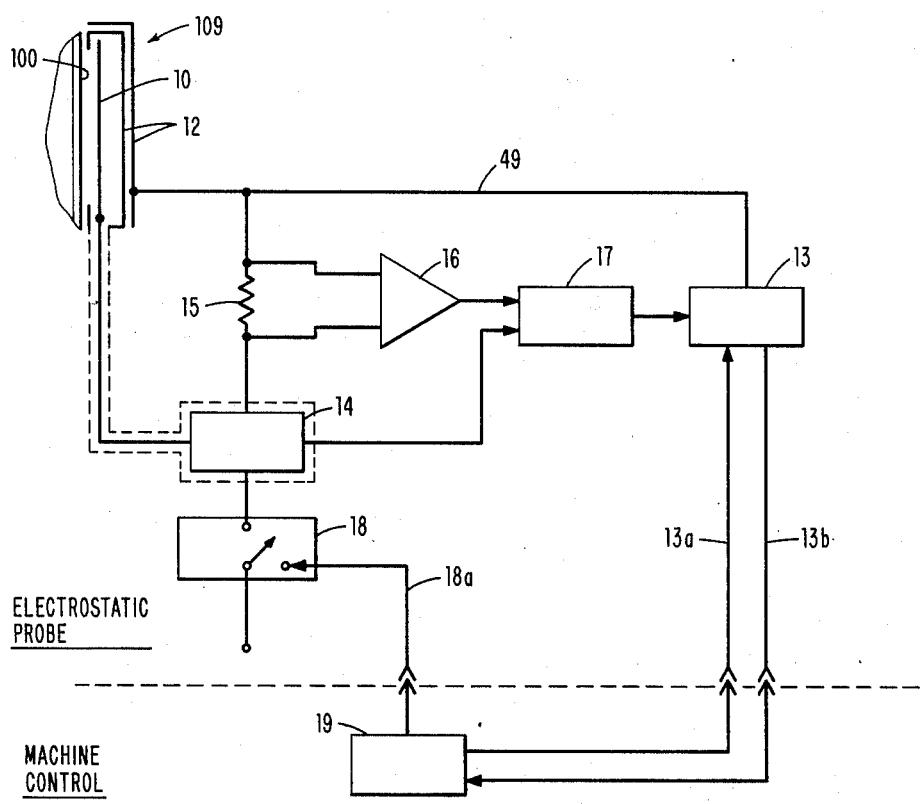
FIG. 2 is a block diagram showing an embodiment of the measurement system of the invention for use on an electrophotographic machine.

FIG. 2 is a block diagram of a measurement system for use with the electrostatic probe 109. A crystal bender element 10 is placed in close proximity to a photoconductive surface 100. The element 10 is surrounded by a shield 12 which is connected by line 49 to a known output potential supplied from the high voltage supply 13. Crystal bender element 10 is driven from a drive oscillator circuit 14 and current produced in the sense portion of bender element 10 is supplied across resistor 15 for detection by the sense amplifier 16. The output of amplifier 16 is then filtered and compared to the phase of the drive oscillator in circuit 17 for altering the level of voltage supplied to shield 12 by high voltage supply circuit 13. In that manner, the known voltage potential on shield 12 is adjusted until the crystal bender element 10 vibrates in an electrostatic field reduced to approximately zero potential. At that point, the current produced in the sense portion of bender element 10 is effectively reduced to zero and the known voltage from supply circuit 13 is equal to the unknown voltage to be measured.

Other elements of the circuit shown in FIG. 2 include a low voltage supply circuit 18 for driving the oscillator 14 and a connection 18a to the machine control logic 19 in order to enable the measurement of the photoconductor voltage at the proper time in the sequential operation of the host machine. Line 13a provides for high voltage shutdown and line 13b is the output line informing the machine control of the measurement value of the photoconductor voltage. Line 13b can carry analog or digital signals as required.

Figure 3:
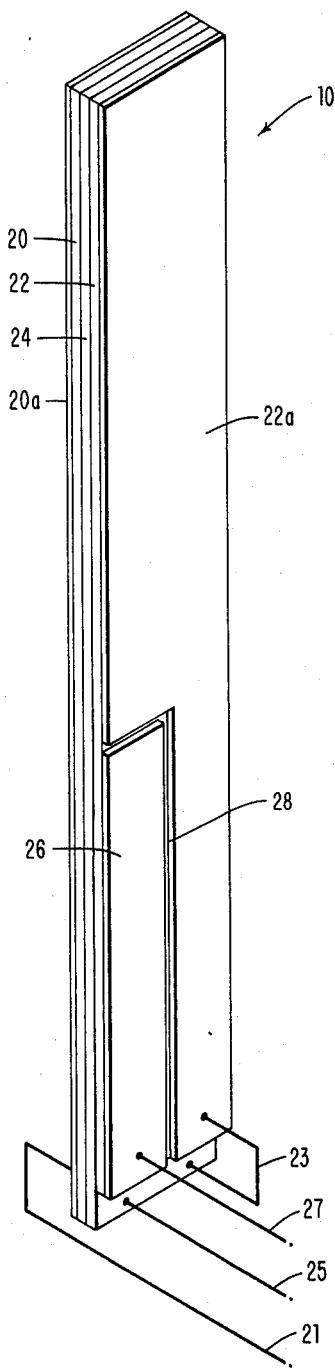
FIG. 3 shows the multilayered construction of the crystal bender element of the electrostatic probe of this invention.

FIG. 3 is a perspective view of the crystal bender element 10 showing the multilayered construction of that device. Layers 20 and 22 are made of piezoceramic material (insulative material) and sandwich a conductive layer 24 therebetween. Layers 20 and 22 are covered with thin conductive coats 20a and 22a along the outer surfaces thereof. The thin conductive surface 22a has been removed along area 28 to provide a separate conductive area 26.

When in use, conductive surface 22a is positioned nearest to the surface to be sensed and is the capacitive sensing element into which a current is induced by vibratory motion. Conductive surface 22a is connected by line 23 to layer 24 and by line 25 to shield 12 (connected to layer 32 of shield 12 as fully shown in FIG. 6, to be described later). Shield 12 is connected to the sense resistor and amplifier.

Piezoceramic layer 20 is the drive element and is connected through line 21 to the output of the oscillator circuit 14 and by layer 24 and line 25 to the shield 12 to complete the circuit to the oscillator common (as shown more fully in FIG. 6, described later).

Figure 6:
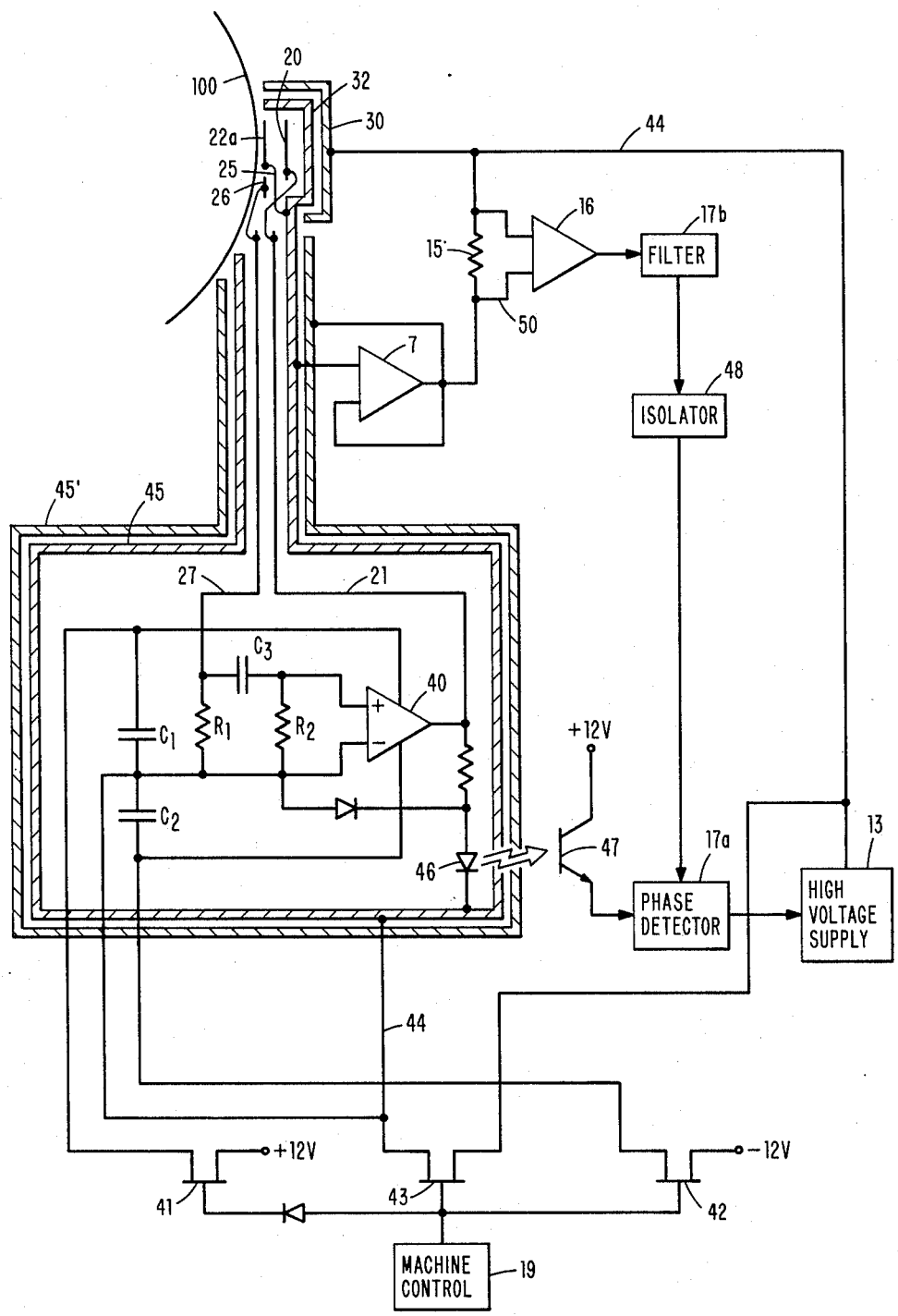
FIG. 6 illustrates the connection of a crystal oscillator to the probe and a variation on the circuit of FIG. 2.

Conductive area 26 acts as a part of the feedback element (together with piezoceramic layer 22) and is connected by line 27 to the input of the oscillator and through layer 24, line 25 and the shield 12 to the oscillator common (FIG. 6).

Piezoceramic bender elements of the type shown in FIG. 3 are commercially available and are typically used as plate resonators for the transmission and reception of acoustic signals. They are commonly used for remote control devices to change channels in a television set. The commercially available bender element is altered to provide the construction shown in FIG. 3 by etching the surface 22a at area 28 to provide the feedback element 26 separate from the sense element 22a.

Figure 4:
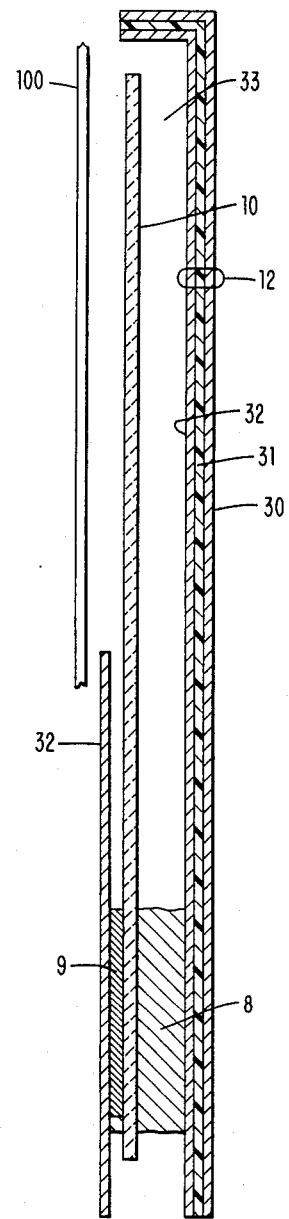
FIG. 4 is a cutaway side view of the probe of FIG. 3 showing the shield as well as the bender element.

FIG. 4 shows a cutaway side view of the electrostatic probe assembly with the crystal bender element 10 shown mounted in relation to the shield 12. Any appropriate mounting means can be used including an epoxy compound 8 with an appropriate spacer 9. FIG. 4 shows that the shield 12 is a multilayered shield made up of three materials, an outer conducting element 30, an insulating element 31 and an inner conducting element 32. An air gap 33 is maintained between shield 12 and bender element 10, and the bender element 10 is positioned near the photoconductive surface 100.

Figure 5:
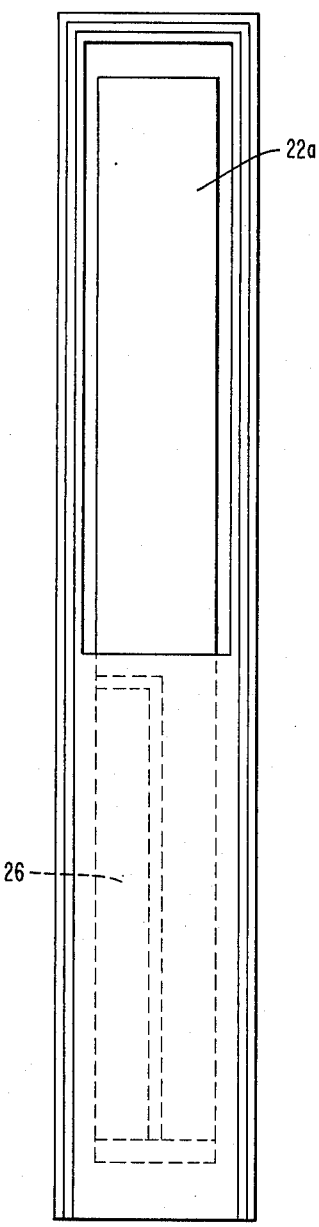
FIG. 5 is a front view of the probe of FIG. 4 as seen from the surface containing the electrostatic potential to be measured.

FIG. 5 is a front view of the probe looking toward it from the photoconductive surface. FIG. 5 shows that the conductive surface 22a is exposed to the photoconductive surface through an opening (window) in the shield 12.

FIG. 6 shows the details of a suitable drive oscillator circuit for use with the probe of this invention. The circuit shown in FIG. 6 is the same as that shown in FIG. 2 except that a second shield 45' has been provided around the drive oscillator and a voltage follower circuit 7 has been provided to feed the sensed current into the sense amplifier 16.

The purpose of the second shield 45' is to provide a low impedance shield around the drive oscillator to limit the amount of stray voltage signals which might be picked up and provided to the sense amplifier. In that manner, the number of filter stages can be reduced.

FIG. 6 shows that an op amp 40 provides an output drive signal over line 21 to the drive element 20. Positive feedback is provided from feedback element 26 through line 27 to op amp 40. Resistors R1 and R2 together with capacitance C3 are used to set the phase relationship of the feedback signal in order to provide a closed loop gain greater than one. With this circuit, positive feedback occurs and the circuit breaks into oscillation at the resonant frequency of the piezoceramic bender element.

The drive oscillator is connected to a low voltage supply (12 volts) supplied through field effect transistors (FETs) 41, 42 and 43. FET 43 acts to float the oscillator common at the high voltage supply output signal to allow circuit operation with a high voltage reference. The high voltage signal is also connected through line 44 to the inner shield 45. A machine control 19 acts to open the switches 41, 42, and 43 during a measurement period thus allowing the circuit to additionally float on the sensed potential. Similarly, machine control 19 closes the switches at a suitable time prior to the measurement period in order to set the bender element into oscillation and to charge energy storing elements, capacitors C1 and C2. Those capacitors are used to continue driving the oscillator during the measurement period when the low voltage source is disconnected An optical isolator comprised of light source 46 and photodetector 47 is used to isolate the shield 45 from low impedance feedback which might be present in the phase detector circuit 17a. It also acts to isolate the high voltage common used in the drive oscillator from ground used in the phase detector 17a. A second optical isolator 48 is similarly used to isolate the high voltage common in the sense amplifying and filter circuit from the ground used with the phase detector.

The principles of operation of the electrostatic probe and its circuit will now be explained. Sense load resistor 15 is connected between line 49 which is at high voltage potential and line 50 which is also at high voltage potential but which carries the current produced in sense element 22a as well. Thus, the current flow in sensing resistor 15 is produced by only the few millivolts of potential difference between lines 49 and 50 due to the sense element 22a. In that manner, the sensed voltage of a few millivolts rides on the high voltage signal of perhaps 800 volts and, despite that, can be detected to provide an appropriate drive for the sense amplifier 16.

Since the drive oscillator operates at a 12 volt potential and the sense signal is only a few millivolts, the sense signal must be shielded from the oscillator drive signal. It is primarily for that reason that the oscillator circuit is encased in shield 45. Note that shield 45 is at high voltage potential and thus the oscillator voltage of ±12 volts also floats on the high voltage signal.

In order to detect the currents produced by the small sensed voltage produced by sense element 22a, sense resistor 15 is a high impedance element. To prevent the coupling of any low impedances in parallel with resistor 15, the low voltage supply circuit is disconnected by switch 43 during the measurement period. Also, the optical isolator formed by light source 46 and photodetector 47 is used to decouple low impedances in the phase detector.

As already explained, the sensing element 22a is positioned close to the photoconductor surface and thus is positioned in the electrostatic field produced between the photoconductor and the high voltage potential present on shield 32 (which is connected to shield 45). As the sense element 22a vibrates in this field, the capacitance of the element 22a with respect to the photoconductor 100 changes. As the capacitance changes, the charge level on the sense element 22a changes according to the formulation $Q=CV$ where V is the value of the electrostatic field, Q is the produced charge in element 22a and C is the capacitance. The change in the charge Q produced on the sense element 22a creates a current flow and it is that current flow that is coupled through line 25, shield plate 32, and shield 45 to the sense resistor 15. As the output signal produced by high voltage supply 13 is changed to equal the photoconductor voltage 100, the electrostatic field potential V is effectively eliminated and the current produced in the vibrating sense element 22a is effectively reduced to zero. At that time, the voltage on line 49 is a measure of the voltage on the photoconductor 100.

It may be observed that since element 22 is a piezoceramic device, a second voltage is induced into the sense element 22a as a result of the physical stress placed upon element 22 as it is deformed by drive element 20. This piezoceramic induced voltage is not coupled back into resistor 15 since connector 23, FIG. 3, places both sides of the element 22 (conductors 22a and 24) at the same potential. Thus, currents in element 22a produced by the piezoelectric effect in element 22 are shorted back across the crystal 22.

In FIG. 5, note that the feedback element 26 is located outside the influence of the electrostatic field between photoconductor 11 and shield 32. As a consequence, the feedback voltages produced in the element 26 are the result of the piezoelectric effect and not the result of vibration in the electrostatic field. FIGS. 3 and 6 show that element 26 is connected through line 27 to one side of the drive oscillator and the other side of the drive oscillator (oscillator common) through conducting layer 24 and line 25 to shields 32 and 45. In that manner, a circuit is provided through the piezoceramic element 26 so that the piezoelectric feedback voltage produced therein is fed back to the oscillator.

What has been described is a unique electrostatic probe built from a simple, readily available, and cheap piezoceramic bender element which provides drive, sense, and feedback capabilities all in one. A drive oscillator for the probe is enclosed in a shield and is allowed to float at high voltage potential together with the sensed signal.

While the electrostatic probe and its associated circuit has been discussed with reference to an electrophotographic machine in sensing the voltage on a photoconductor, the probe and its circuit are of value in any application in which accurate sensing of an electrostatic field is needed. For example, in many processes relating to the production of various plastic articles it may be desirable to sense for a buildup of charge on the surface of the plastic. This probe and its unique construction would be of value in such an application.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A probe device for measuring electrostatic surface potential comprising:
   a multilayered piezoceramic bender element assembly comprising an inner conductive layer sandwiched between first and second piezoceramic layers, each piezoceramic layer having a conductive coating on its outer surface;
   the conductive coating of said second piezoceramic layer divided into first and second electrically unconnected areas, the first area serving as part of a piezoelectric sense element and the second area serving as part of a piezoelectric feedback element, said first area electrically connected to said inner conductive layer to place both sides of said second piezoceramic layer at the same potential;
   said first piezoceramic layer serving as a drive element to vibrate said bender element assembly;
   a shield completely surrounding said bender element except for an opening on one side which enables said conductive sense element to be positioned in close proximity to a surface whose potential is to be measured, wherein said shield is comprised of an outer conductive layer, an inner conductive layer, and an insulative layer therebetween,
   a high voltage source means for producing an output signal connected to the inner and outer layers of said shield;
   said conductive sense layer connected to the inner layer of said shield;
   a high impedance sense means connected between said inner and outer layers of said shield for producing a sense voltage thereacross proportional to current produced in said sense layer; and
   circuit means connected to said high voltage source means and to said sense means for utilizing said sense voltage to vary the output signal of said high voltage source means until said sense voltage is effectively reduced to zero.

2. The probe device of claim 1 further including:
   drive oscillator means connected to said drive element and to said feedback element for producing a drive signal to set said drive element into oscillation at the natural resonant frequency of said bender element assembly.

3. The probe device of claim 2 further including:
   an oscillator shield completely surrounding said drive oscillator connected to said inner layer of said shield and to said oscillator for causing said oscillator drive signal to float on the high voltage output signal.

4. The probe device of claim 3 further including:
   an oscillator drive voltage source means;
   switch means for connecting said drive oscillator to said oscillator drive voltage source means; and
   first and second energy storing elements connected to said drive voltage source means for continuing the operation of said drive oscillator when said drive voltage source means is disconnected from said drive oscillator by said switch means.

5. An electrophotographic machine comprising:
   a photoreceptive surface mounted for cyclical movement in said machine;
   charging means for placing an electrostatic charge on said surface as it moves thereby;
   imaging means for placing an image on the charged surface;
   developing means for developing said image;
   transfer means for transferring said developed image to image receiving material;
   probe means located between said imaging means and said developing means for measuring surface potential on said photoreceptive surface produced by said electrostatic charge, said probe means comprising:
      a multilayered piezoceramic bender element assembly comprising an inner conductive layer sandwiched between first and second piezoceramic layers, each piezoceramic layer having a conductive coating on its outer surface;
      the conductive coating of said second piezoceramic layer divided into first and second electrically unconnected areas, the first area serving as part of a piezoelectric sense element and the second area serving as part of a piezoelectric feedback element, said first area electrically connected to said inner conductive layer to place both sides of said second piezoceramic layer at the same potential;
      said first piezoceramic layer serving as a drive element to vibrate said bender element assembly;
      a shield completely surrounding said bender element except for an opening on one side which enables said conductive sense element to be positioned in close proximity to a surface whose potential is to be measured, wherein said shield is comprised of an outer conductive layer, an inner conductive layer, and an insulative layer therebetween,
      a high voltage source means for producing an output signal connected to the inner and outer layers of said shield;
      said conductive sense layer connected to the inner layer of said shield;
      a high impedance sense means connected between said inner and outer layers of said shield for producing a sense voltage thereacross proportional to current produced in said sense layer; and
      circuit means connected to said high voltage source means and to said sense means for utilizing said sense voltage to vary the output signal of said high voltage source means until said sense voltage is effectively reduced to zero;
   said machine having a machine control section to produce a signal during a period in which the surface potential is measured.

* * * * *